United States Patent
Lee et al.

(10) Patent No.: US 7,588,991 B2
(45) Date of Patent: Sep. 15, 2009

(54) METHOD FOR FABRICATING EMBEDDED STATIC RANDOM ACCESS MEMORY

(75) Inventors: Tung-Hsing Lee, Taipei County (TW);
Chien-Li Kuo, Hsin-Chu (TW);
Yun-San Huang, Taipei County (TW);
Chih-Ming Su, Tai-Nan (TW);
Buo-Chin Hsu, Taipei County (TW)

(73) Assignee: United Microelectronics Corp., Hsin-Chu (TW)

( * ) Notice: Subject to any disclaimer, the term of this patent is extended or adjusted under 35 U.S.C. 154(b) by 69 days.

(21) Appl. No.: 11/779,880

(22) Filed: Jul. 18, 2007

(65) Prior Publication Data

US 2009/0023256 A1 Jan. 22, 2009

(51) Int. Cl.
*H01L 21/331* (2006.01)
(52) U.S. Cl. .......... 438/311; 438/238; 438/381; 438/514; 257/E21.231; 257/E21.248; 257/E21.257
(58) Field of Classification Search ............ 438/8, 438/9, 197, 199, 106, 108, 311, 238, 381, 438/514
See application file for complete search history.

(56) References Cited

U.S. PATENT DOCUMENTS

| | | | | |
|---|---|---|---|---|
| 5,581,105 A | * | 12/1996 | Huang | 257/369 |
| 5,689,132 A | * | 11/1997 | Ichikawa | 257/357 |
| 6,380,598 B1 | * | 4/2002 | Chan | 257/390 |
| 6,468,855 B2 | * | 10/2002 | Leung et al. | 438/239 |
| 6,573,548 B2 | * | 6/2003 | Leung et al. | 257/296 |
| 7,229,893 B2 | * | 6/2007 | Wang et al. | 438/424 |
| 2003/0032231 A1 | | 2/2003 | Efland et al. | |

* cited by examiner

*Primary Examiner*—David Nhu
(74) *Attorney, Agent, or Firm*—Winston Hsu

(57) ABSTRACT

The present invention provides a method for fabricating an embedded static random access memory, including providing a semiconductor substrate; defining a logic area and a memory cell area on the semiconductor substrate and defining at least a first conductive device area and at least a second conductive device area in the logic area and the memory cell area respectively; forming a patterned mask on the memory cell area and on the second conductive device area in the logic area and exposing the first conductive device area in the logic area; performing a first conductive ion implantation process on the exposed first conductive device area in the logic area; and removing the patterned mask.

22 Claims, 17 Drawing Sheets

METHOD FOR FABRICATING EMBEDDED STATIC RANDOM ACCESS MEMORY

BACKGROUND OF THE INVENTION

1. Field of the Invention

The present invention relates to a method for fabricating an embedded static random access memory, and more particularly, to a method for fabricating an embedded static random access memory with improved random single bit failure rate.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

Please refer to FIG. 1, which shows a circuit diagram of typical six-transistors SRAM (6T-SRAM) 10. The 6T-SRAM cell 10 comprises pull-up transistors 12 and 14, pull-down transistors 16 and 18, and access transistors 20 and 22. These six transistors constitute a set of flip-flops. Pull-up transistors 12, 14 and pull-down transistors 16, 18 constitute a latch that stores data in the storage node 24, 26. Because the pull-up transistors 12, 14 act as power load devices they can be replaced by resistors. At this point, the static random access memory is a four-transistors SRAM (4T-SRAM).

Generally speaking, the pull-up transistors 12, 14 of the 6T-SRAM cell 10 comprise P-type metal oxide semiconductor (PMOS) transistors. The pull-down transistors 16, 18 and the access transistors 20, 22 comprise N-type metal oxide semiconductor (NMOS) transistor. The pull-up transistor 12 and the pull-down transistor 16 constitute a series circuit 28. One end of the series circuit 28 is connected to a power supply 32 and the other end of the series circuit 28 is connected to a ground 34. Equally, the pull-up transistor 14 and the pull-down transistor 18 constitute a series circuit 30. One end of the series circuit 30 is connected to the power supply 32 and the other end of the series circuit 30 is connected to the ground 34.

Additionally, the storage node 24 is connected to the respective gates of the pull-down transistor 18 and the pull-up transistor 14. The storage node 24 is also connected to the drains of the pull-down transistor 16, pull-up transistor 12 and the access transistor 20. Equally, the storage node 26 is connected to the respective gates of the pull-down transistor 16 and the pull-up transistor 12. The storage node 26 is also connected to the drains of the pull-down transistor 18, pull-up transistor 14 and the access transistor 22. The gates of the access transistors 20 and 22 are respectively coupled to a word line 36, and the sources are coupled to a relative data line 38.

The aggressive scaling of MOS transistors faces severe challenges to the effective capacitance, which is usually expressed as dielectric inversion thickness (Tox_INV). When a gate dielectric layer is in an inversion condition, the gate possesses less carrier mobility than metal materials, thus causing lower effective capacitance. There are two primary methods for improving the effective capacitance. One is to improve the property of the gate dielectric layer, such as using high-K materials or decreasing the thickness of the gate dielectric layer. The other one is to decrease the depletion region of the gate, such as doping atoms or implanting ions on the polysilicon gate to improve the carrier mobility.

U.S. Patent No. 2003/0032231 A1, paragraphs 38 and 47, teaches a most common method used in industry to effectively decrease the Tox_INV by providing a N+ polysilicon doping process to the N type polysilicon of NMOS devices.

Please refer to FIG. 2, which illustrates a schematic plan view of an embedded static random access memory. As shown in FIG. 2, a semiconductor substrate 40 is provided. A memory cell area 42 and a logic area 44 are defined on the semiconductor substrate 40. According to different designs and functional desires for the electrical circuits, a plurality of active areas 46, N wells 48 and P wells 50 are formed respectively in the memory cell area 42 and the logic area 44 of the semiconductor substrate 40.

A patterned silicon layer 52 is deposited on the N well 48, the P well 50 and the active area 46. At this point, a 6T-SRAM cell 60 is defined in the memory cell area 42, and a logic device 80, which comprises a complementary metal oxide semiconductor (CMOS), is defined in the logic area 44.

As shown in FIG. 2, the 6T-SRAM cell 60 comprises pull-up transistor 62, 64, pull-down transistors 66, 68, and access transistors 70, 72. The pull-up transistor 62 and the pull-down transistor 66 comprise a common gate 74. The pull-up transistor 64 and the pull-down transistor 68 comprise a common gate 76. The access transistors 70 and 72 comprise a common gate 78. Additionally, the logic device 80 in the logic area 44 comprises a PMOS transistor 82 with a gate 86 and an NMOS transistor 84 with a gate 88.

When the method disclosed in U.S. Patent No. 2003/0032231 A1 is performed to reduce the gate depletion region, the gate formed on the P well 50 is doped with N+ dopant. It should be noted that the pull-up transistor 62 and the pull-down transistor 66 comprise a common gate 74, and the pull-up transistor 64 and the pull-down transistor 68 comprise a common gate 76. The portion of the common gates 74 and 76 located on the P well 50 are the gates (which belong to the pull-down transistors 66 and 68) doped with N+ dopant. Equally, the portion of the common gates 74 and 76 located on the N well are the gates (which belong to the pull-up transistors 62 and 64) are the gates doped with no N+ dopant.

In an ideal condition, the symmetrical common gates 74 and 76 belonging to the pull-down transistors 66 and 68 respectively have the same N+ dosage. According to some manufacturing or non-manufacturing factors such as the misalignment of the active area, the deviation of the critical dimension of gates, the shift of the mask for the N+ polysilicon doping process, however, the symmetrical common gates 74 and 76 usually possess unsymmetrical N+ dosage. This unsymmetrical dosage causes increasing deviations of the relative saturated current of the drain regions in the pull-up transistors 62 and 64. The current deviation induces the failure to the memory cell, namely the bit data stored in this memory cell fail. Thereby, N+ polysilicon doping process can reduce the Tox_INV, but it also increases the random single bit (RSB) failure rate in the memory array.

It would thus be highly desirable to provide a method for fabricating an embedded SRAM with improved RSB failure rate.

SUMMARY OF THE INVENTION

The present invention relates to a method for fabricating an embedded static random access memory (SRAM), and more particularly, to a method for fabricating an embedded SRAM with improved random single bit (RSB) failure rate.

According to the claims, the present invention provides a method for fabricating an embedded SRAM, the method comprising providing a semiconductor substrate, defining a logic area and a memory cell area on the semiconductor substrate, defining at least a first conductive device area and at least a second conductive device area in the logic area and the memory cell area respectively; forming a patterned mask on the memory cell area and the second conductive device area in the logic area and exposing the first conductive device area in the logic area; performing a first conductive ion implantation process on the exposed first conductive device area in the logic area; and removing the patterned mask.

According to the claims, the present invention further provides a method for fabricating an embedded SRAM, the method comprising providing a semiconductor substrate, the semiconductor substrate defining a logic area and a memory cell area; defining at least an NMOS transistor area and at least a PMOS transistor area in the logic area; defining at least a pull-up transistor area and at least a pull-down transistor area in the memory cell area; forming a patterned mask on the pull-up transistor area, pull-down transistor area in the memory cell area and on the PMOS transistor area in the logic area and exposing the NMOS transistor area in the logic area; performing an N type ion implantation process on the exposed NMOS transistor area in the logic area; and removing the patterned mask.

According to the claims, the present invention further provides a method for fabricating an embedded SRAM, the method comprising providing a semiconductor substrate, the semiconductor substrate defining a logic area and a memory cell area; defining at least an NMOS transistor area and at least a PMOS transistor area in the logic area; defining at least a pull-up transistor area and at least a pull-down transistor area in the memory cell area; forming a patterned mask on the pull-up transistor area, pull-down transistor area in the memory cell area and the NMOS transistor area in the logic area; exposing the PMOS transistor area in the logic area; performing a P type ion implantation process on the exposed PMOS transistor area in the logic area; and removing the patterned mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
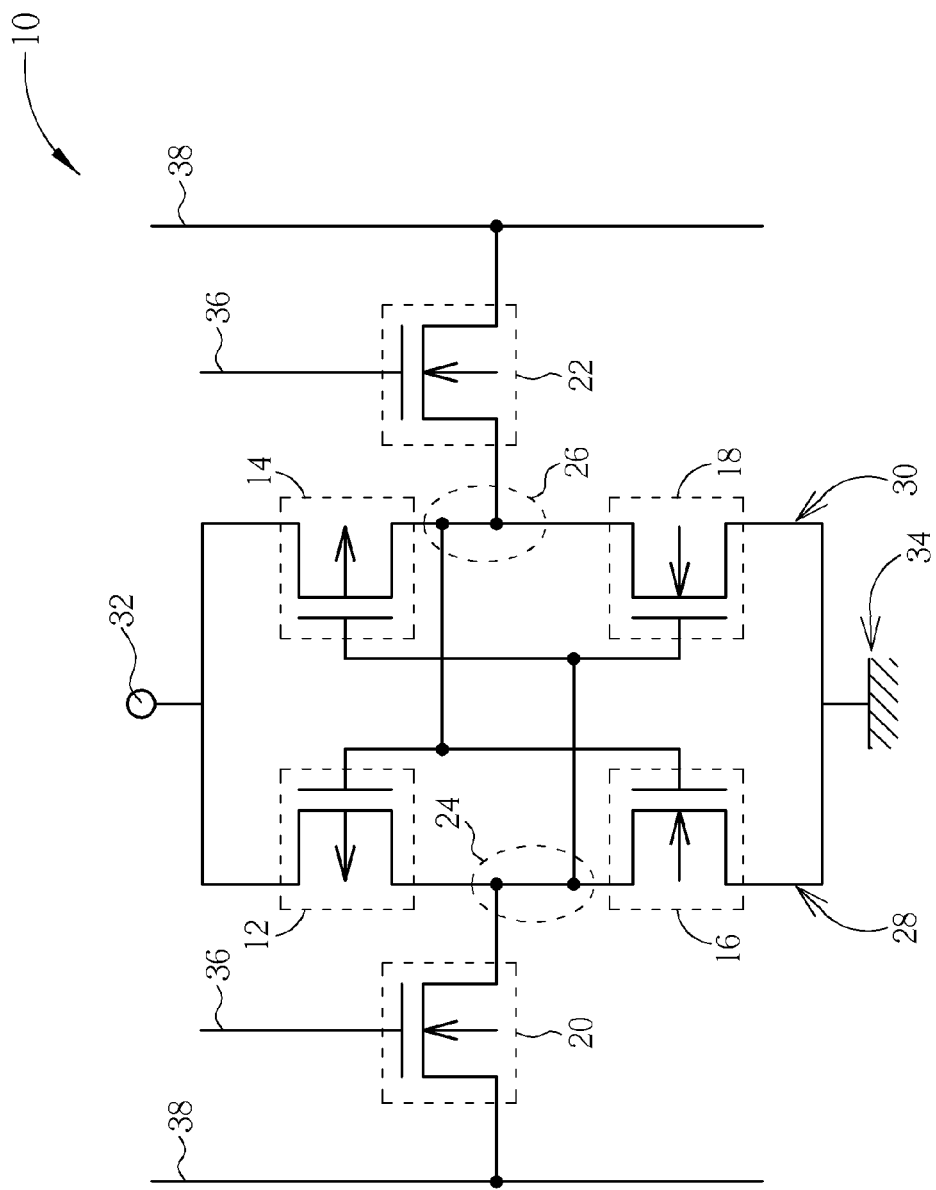
FIG. 1 shows a circuit diagram of a typical six transistors static random access memory.
Figure 2:
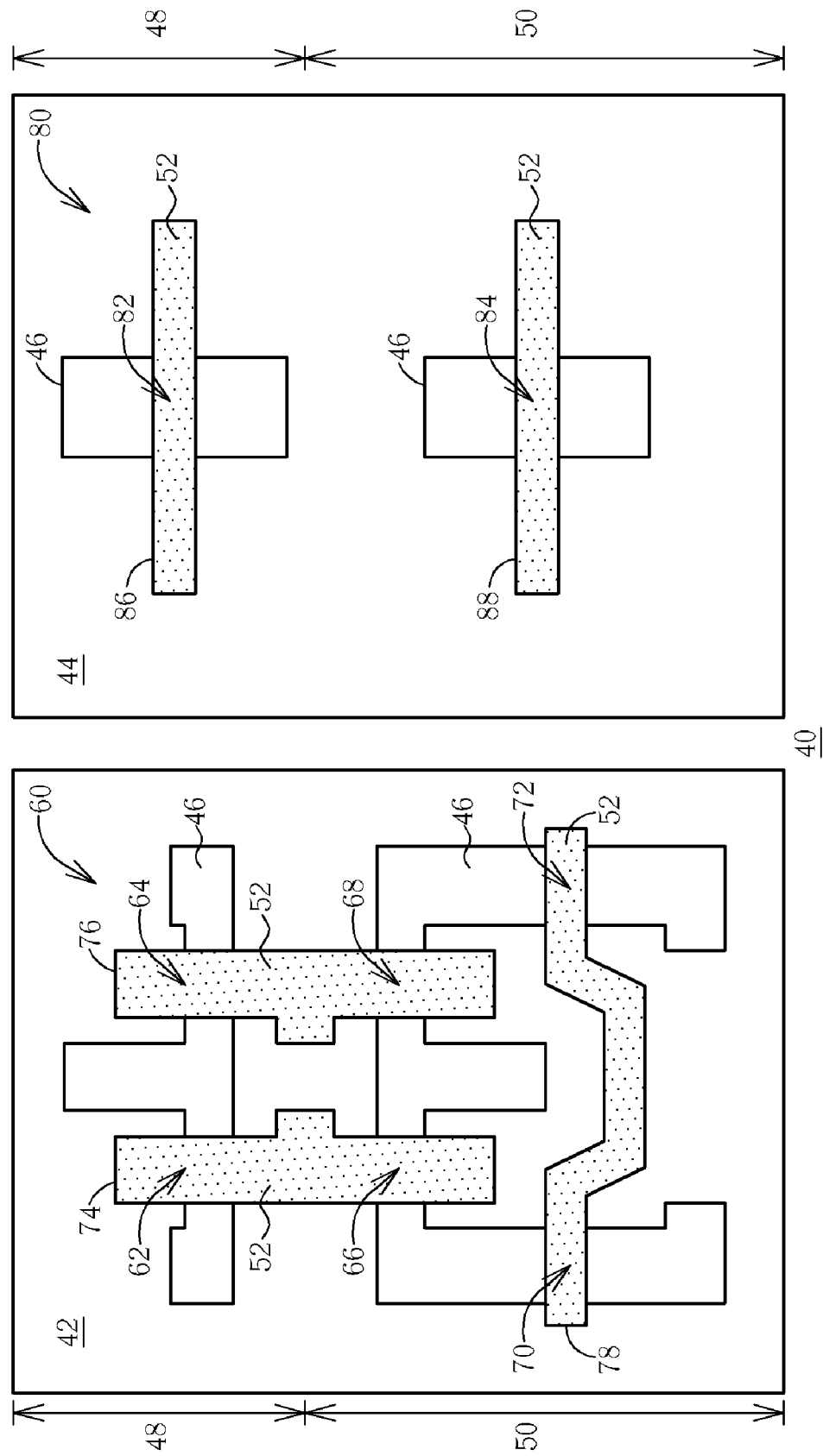
FIG. 2 shows a schematic plan view of an embedded static ransom access memory in accordance with the prior art.
Figure 3:
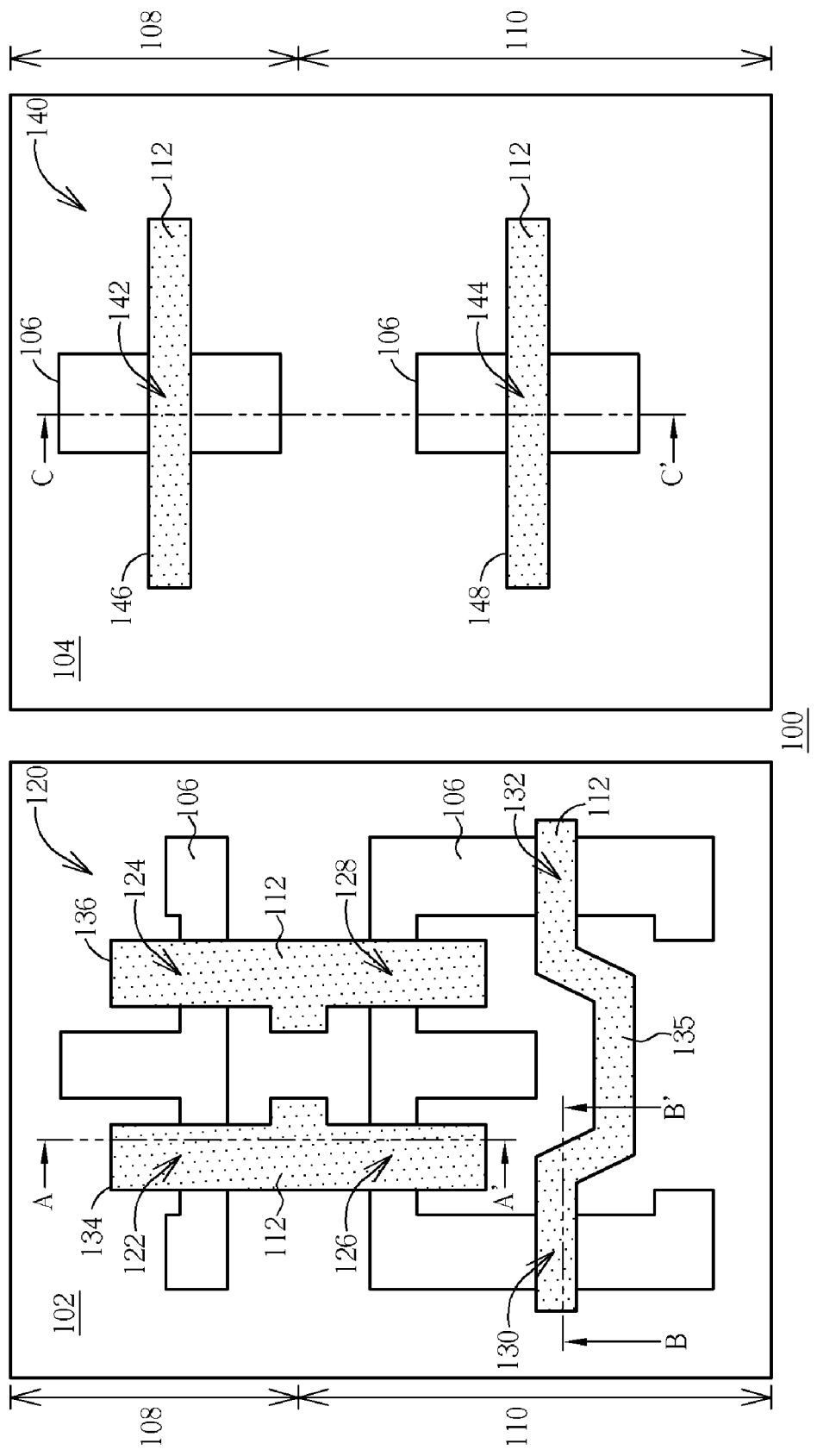
FIG. 3 shows a schematic plan view of an embedded static ransom access memory in accordance with the present invention.

Please refer to FIG. 3, which shows a schematic plan view of an embedded static ransom access memory in accordance with the present invention. A semiconductor substrate 100 is provided. A memory cell area 102 and a logic area 104 are defined on the semiconductor substrate 100. According to different designs and functional desires for the electrical circuits, a plurality of active areas 106, N wells 108 and P wells 110 are formed respectively in the memory cell area 102 and the logic area 104 of the semiconductor substrate 100. Therefore, P type conductive devices are formed on the N well 108 and N type conductive devices are formed on the P well 110. The N well 108 may comprise a plurality of P type conductive device areas, on which a P type conductive device is formed. Equally, the P well 110 may comprise a plurality of N type conductive device areas, on which an N type conductive device is formed. Subsequently, a patterned silicon layer 112 is deposited on the N well 108, the P well 110 and the active areas 106. Thereafter, a corresponding source/drain implantation process is carried out. At this point, a 6T-SRAM cell 120 is defined in the memory cell area 102, and a logic device 140, which may comprise a complementary metal oxide semiconductor (CMOS), is defined in the logic area 104.

As shown in FIG. 3, the 6T-SRAM cell 120 in the memory cell area 102 comprises pull-up transistors 122, 124, pull-down transistors 126, 128 and access transistors 130, 132. The pull-up transistor 122 and the pull-down transistor 126 comprise a common gate 134. The pull-up transistor 124 and the pull-down transistor 128 comprise a common gate 136. The access transistors 130 and 132 comprise a common gate 135. Additionally, the logic device 140 in the logic area 104 comprises a PMOS transistor 142 with a gate 146 and a NMOS transistor 144 with a gate 148.

Figure 4:
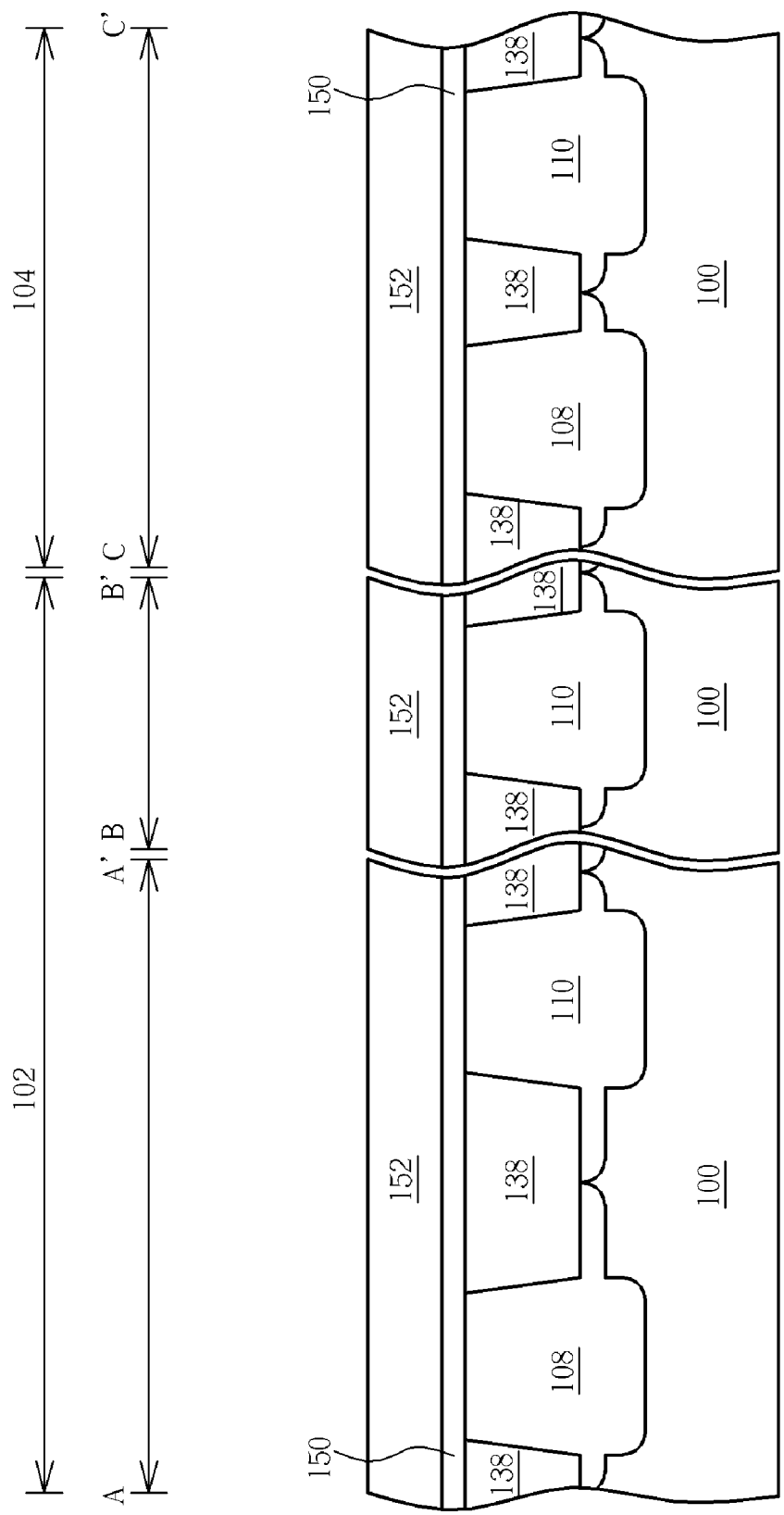
FIG. 4 to FIG. 6 shows cross-sectional diagrams taken along line AA', BB' and CC' in FIG. 3, illustrating a fabricating method for an embedded SRAM in accordance with the first preferred embodiment of the present invention.
Figure 5:
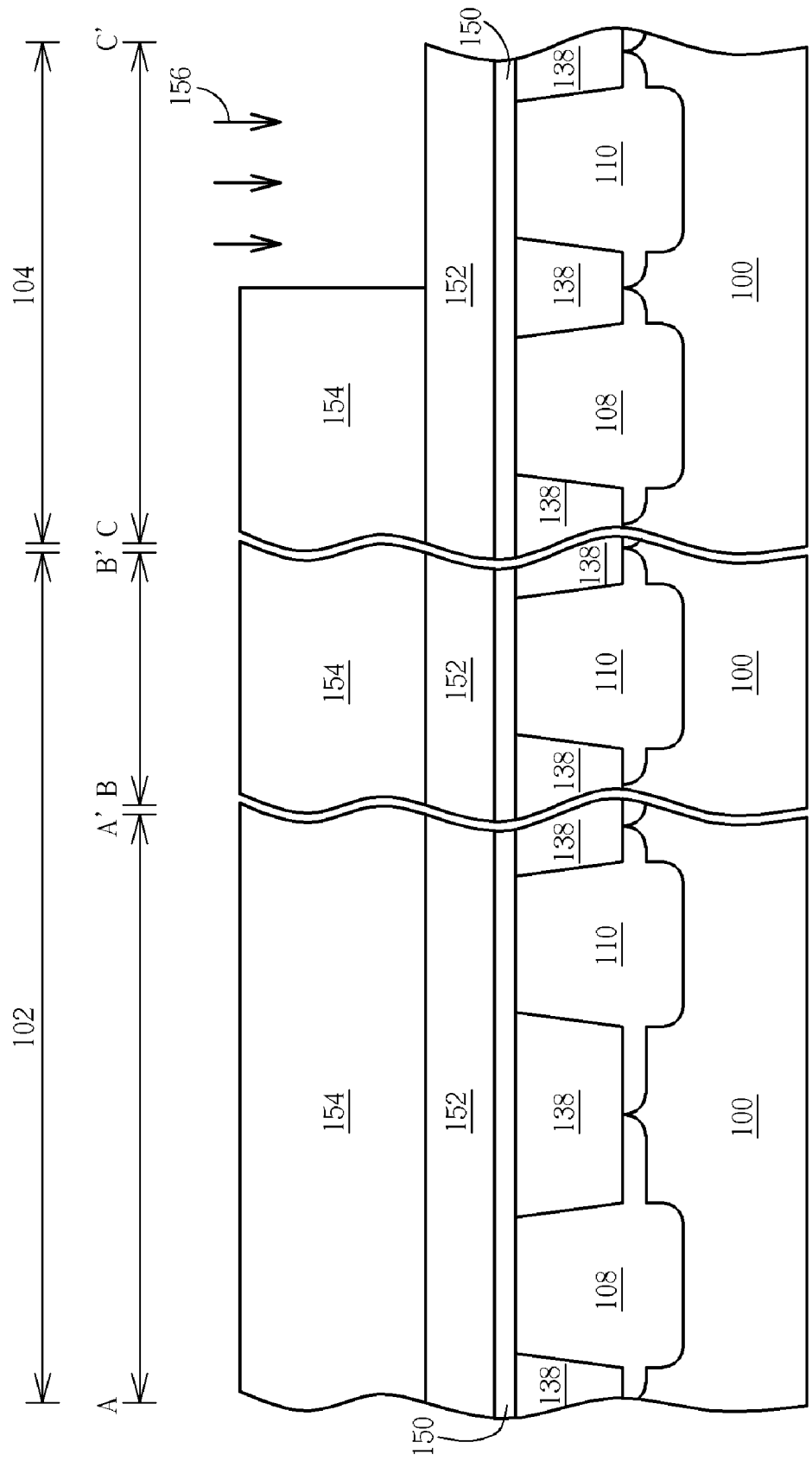
Figure 6:
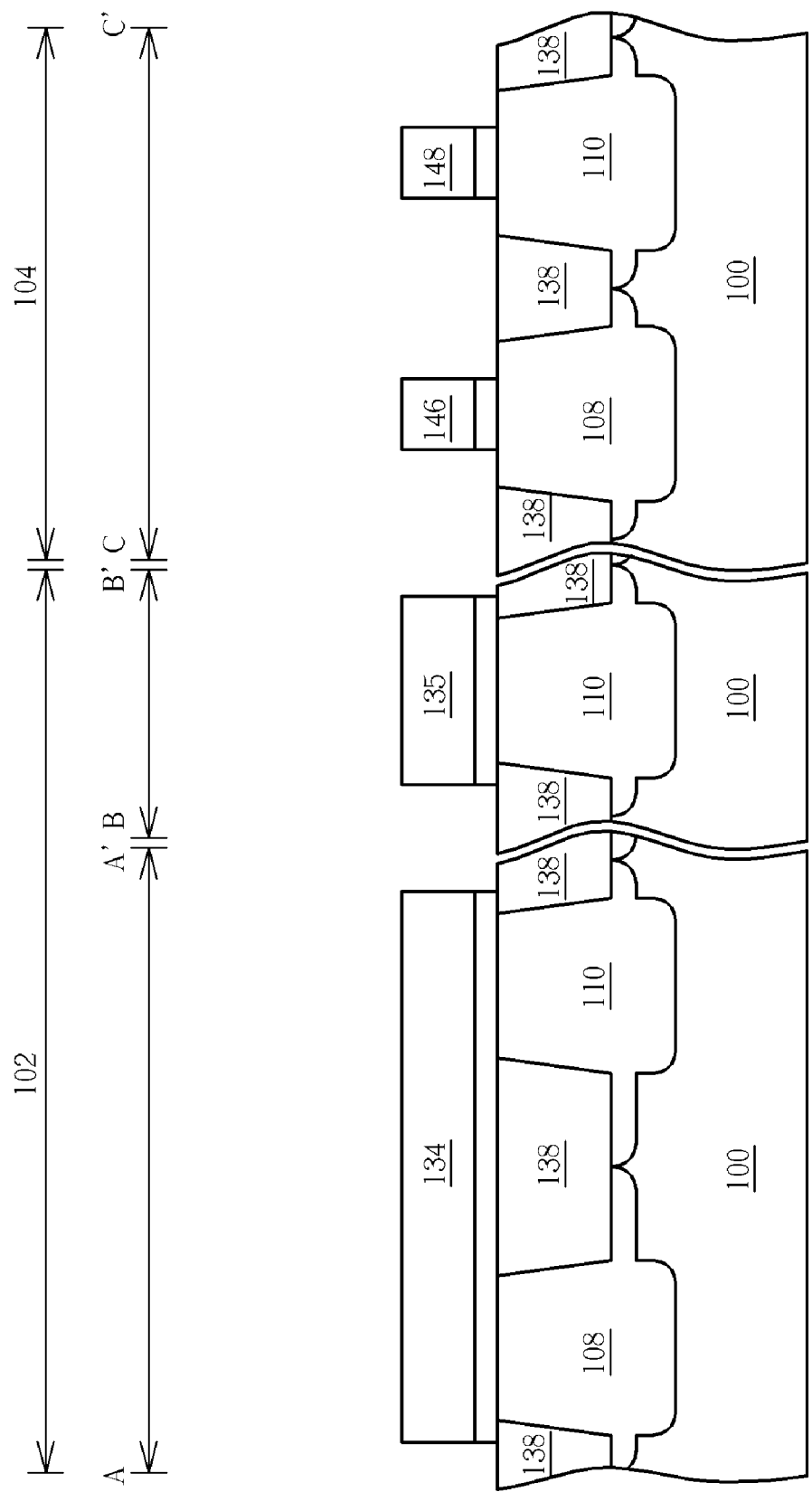

FIG. 4 to FIG. 6 illustrate a fabricating method for the embedded static ransom access memory shown in FIG. 3 in accordance with the first preferred embodiment of the present invention. For highlighting the characteristic of the present invention and for clarity of illustration, FIG. 4 to FIG. 6 merely show the cross-sectional diagrams taken along lines AA', BB' and CC' in FIG. 3. Please refer to FIG. 4. A semiconductor substrate 100 is provided, such as a silicon substrate or a silicon-on-insulator (SOI) substrate, but not limited thereto. The semiconductor substrate 100 comprises at least an N well 108 and at least a P well 110, wherein the N well 108 and the P well 110 are isolated by a shallow trench isolation (STI) 138. Subsequently, a conformal dielectric layer 150 such as silicon oxide component, silicon nitride component or any insulating materials is blanket deposited on the surface of the semiconductor substrate 100. Then, a silicon layer 152 such as polysilicon, metal silicide or any conductive materials is deposited on the dielectric layer 150.

As shown in FIG. 5, a patterned mask 154 such as a photoresist is coated on the silicon layer 152 in the memory cell area 102. The patterned mask is also coated on the silicon layer 152 on the N well 108 in the logic area 104. Only the silicon layer 152 on the P well 110 in the logic area 104 is exposed. Subsequently, a N+ ion implantation process 156 is carried out on the exposed silicon layer 152. Thereafter, the patterned mask 154 is removed. According to the first preferred embodiment of this invention, the chemical composition of the N+ ion implantation process 156 may be any N type dopant such as phosphorus, with a dose of about 5E15 ions/cm$^2$, at an energy of between about 4 KeV to 5 Kev.

As shown in FIG. 6, an etching process (not shown) is carried out to etch the silicon layer 152 and the dielectric layer 150 thereby forming gates 134, 135, 146 and 148 as shown in FIG. 3. The gates 134, 135 and 146 are doped without ions, but the gate 148 is doped with N+ ion. The N+ ion implantation process 156 shown in FIG. 5 may be carried out after the etching process shown in FIG. 6. Those skilled in the art will readily observe that numerous modifications and alterations of the method may be made while retaining the teachings of the invention.

Finally, spacers are formed on sidewalls of the gate 134, 135, 146 and 148. A patterned mask is coated on the N well 108 (not shown). Then an N type source/drain implantation process is carried out thereby forming a source/drain region in the P well 110 of the semiconductor substrate 100 (not shown). Thereafter, the patterned mask is removed. Subsequently, a patterned mask is coated on the P well 110. A P type source/drain implantation process is carried out thereby forming a source/drain region in the N well 108 of the semiconductor substrate 100 (not shown). Thereafter, the patterned mask is removed. According to the first preferred embodiment of this invention, the chemical specie of the N type source/drain implantation process may be any N type dopant such as phosphorus, with a dose of between about 2E15 to 3E15 ions/cm$^2$, at an energy of about 3 KeV. It should be noted that the N type source/drain implantation process might also be carried out on the gate of the pull-down transistor 126, 128 or the gate of the access transistor 130, 132. The N type source/drain ion may be treated as a complementary ion, which complements skipping a step of the N+ ion implantation process 156 performed on the gate of each transistor in the memory cell area 102.

Figure 7:
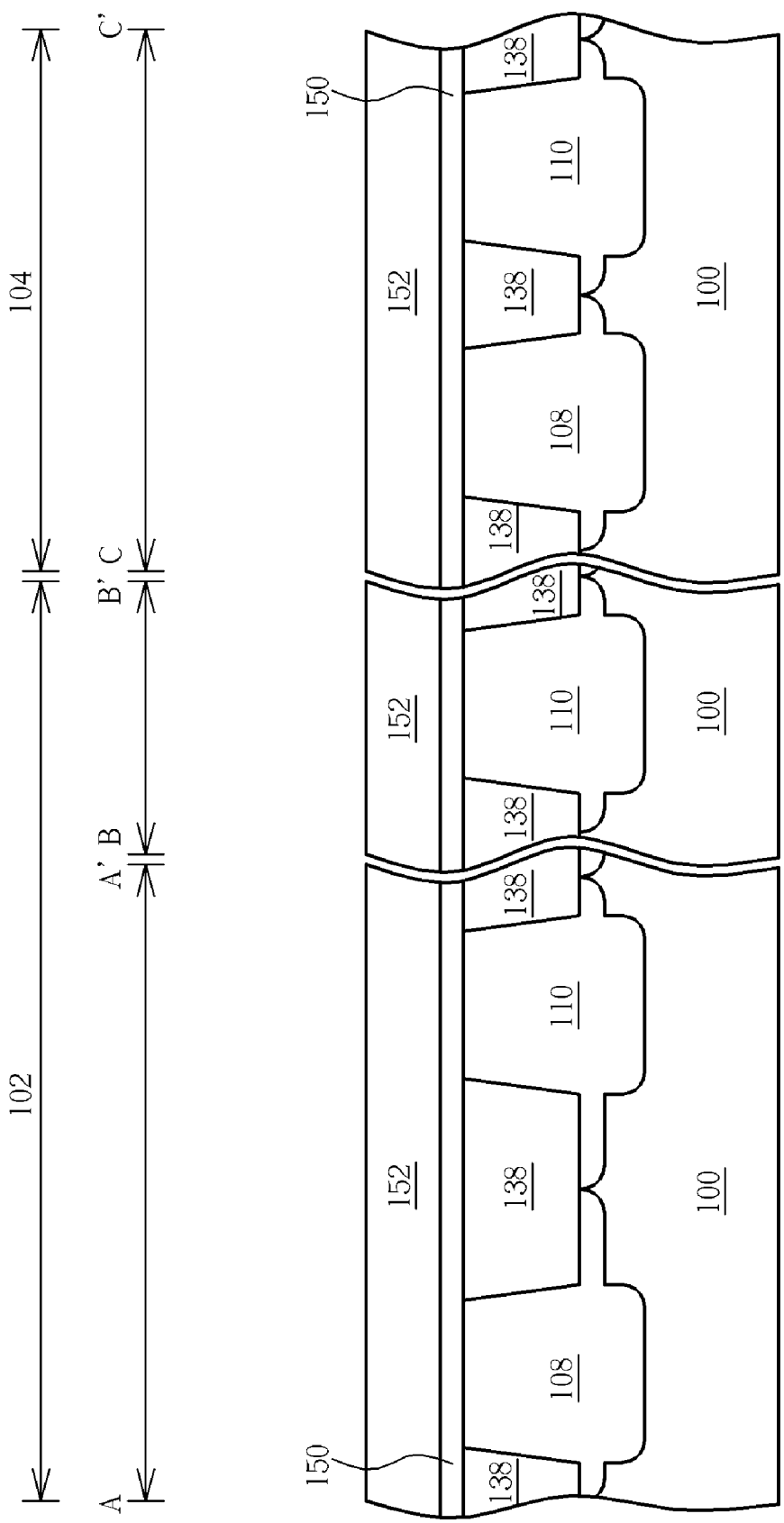
FIG. 7 to FIG. 10 shows cross-sectional diagrams taken along lines AA', BB' and CC' in FIG. 3, illustrating a fabricating method for an embedded SRAM in accordance with the second preferred embodiment of the present invention.

Please refer to FIG. 7 to FIG. 10, which illustrate another fabricating method for the embedded static ransom access memory shown in FIG. 3 in accordance with the second preferred embodiment of the present invention. For highlighting the characteristics of the present invention and for clarity of illustration, FIG. 7 to FIG. 10 merely show the cross-sectional diagrams taken along lines AA', BB' and CC' in FIG. 3. As shown in FIG. 7, a semiconductor substrate 100 is provided, such as a silicon substrate or a silicon-on-insulator (SOI) substrate, but not limited thereto. The semiconductor substrate 100 comprises at least an N well 108 and at least a P well 110, wherein the N well 108 and the P well 110 are isolated by a shallow trench isolation (STI) 138. Subsequently, a conformal dielectric layer 150 such as silicon oxide component, silicon nitride component or any insulating material is blanket deposited on the surface of the semiconductor substrate 100. Then, a silicon layer 152 such as polysilicon, metal silicide or any conductive material is deposited on the dielectric layer 150.

Figure 8:
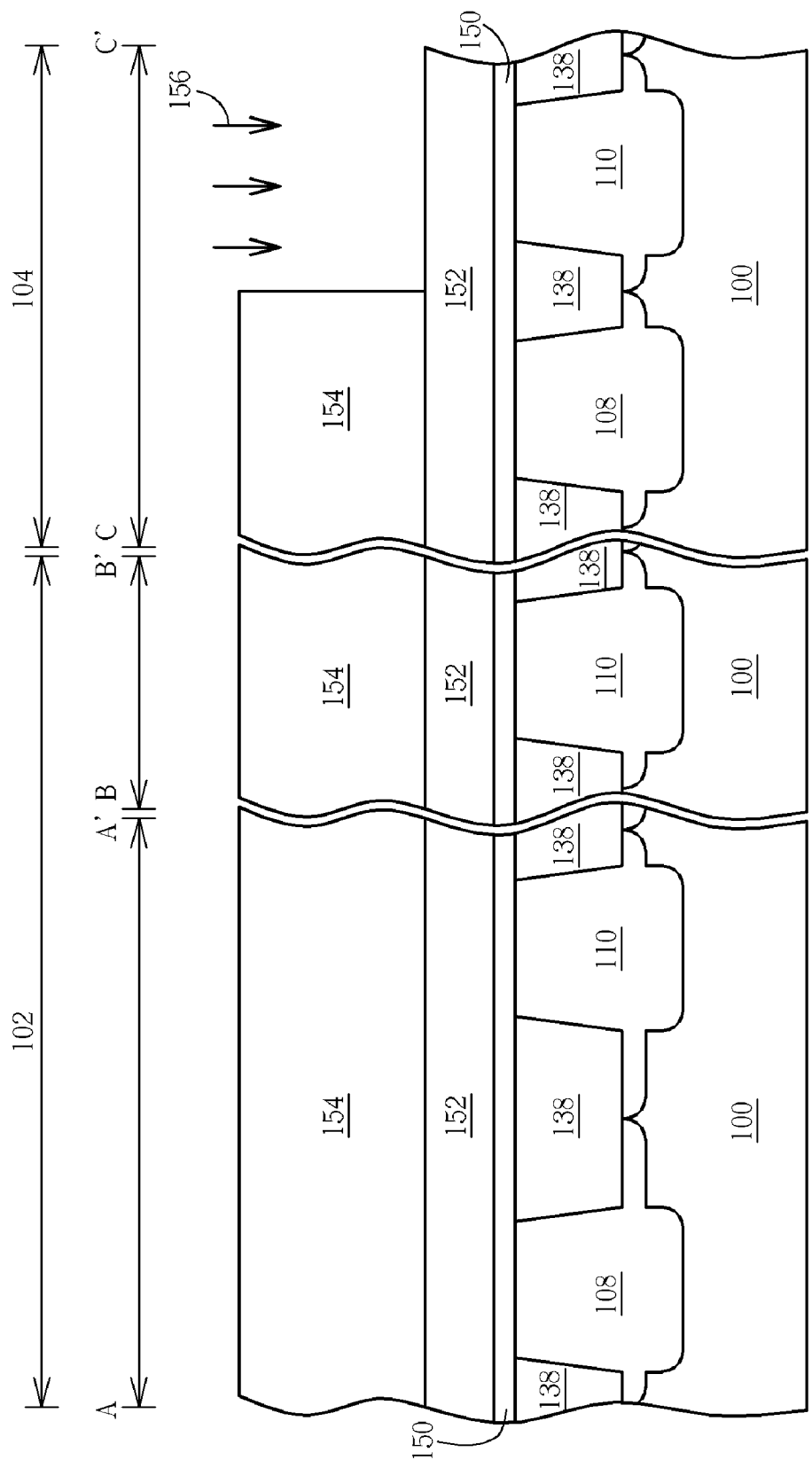

As shown in FIG. 8, a patterned mask 154 such as a photoresist is coated on the silicon layer 152 in the memory cell area 102. The patterned mask is also coated on the silicon layer 152 on the N well 108 in the logic area 104. Namely, only the silicon layer 152 on the P well 110 in the logic area 104 is exposed. Subsequently, an N+ ion implantation process 156 is carried out on the exposed silicon layer 152. Thereafter, the patterned mask 154 is removed. According to the second preferred embodiment of this invention, the chemical composition of the N+ ion implantation process 156 may be any N type dopant such as phosphorus, with a dose of about 5E15 ions/cm$^2$, at an energy of between about 4 KeV to 5 Kev.

Figure 9:
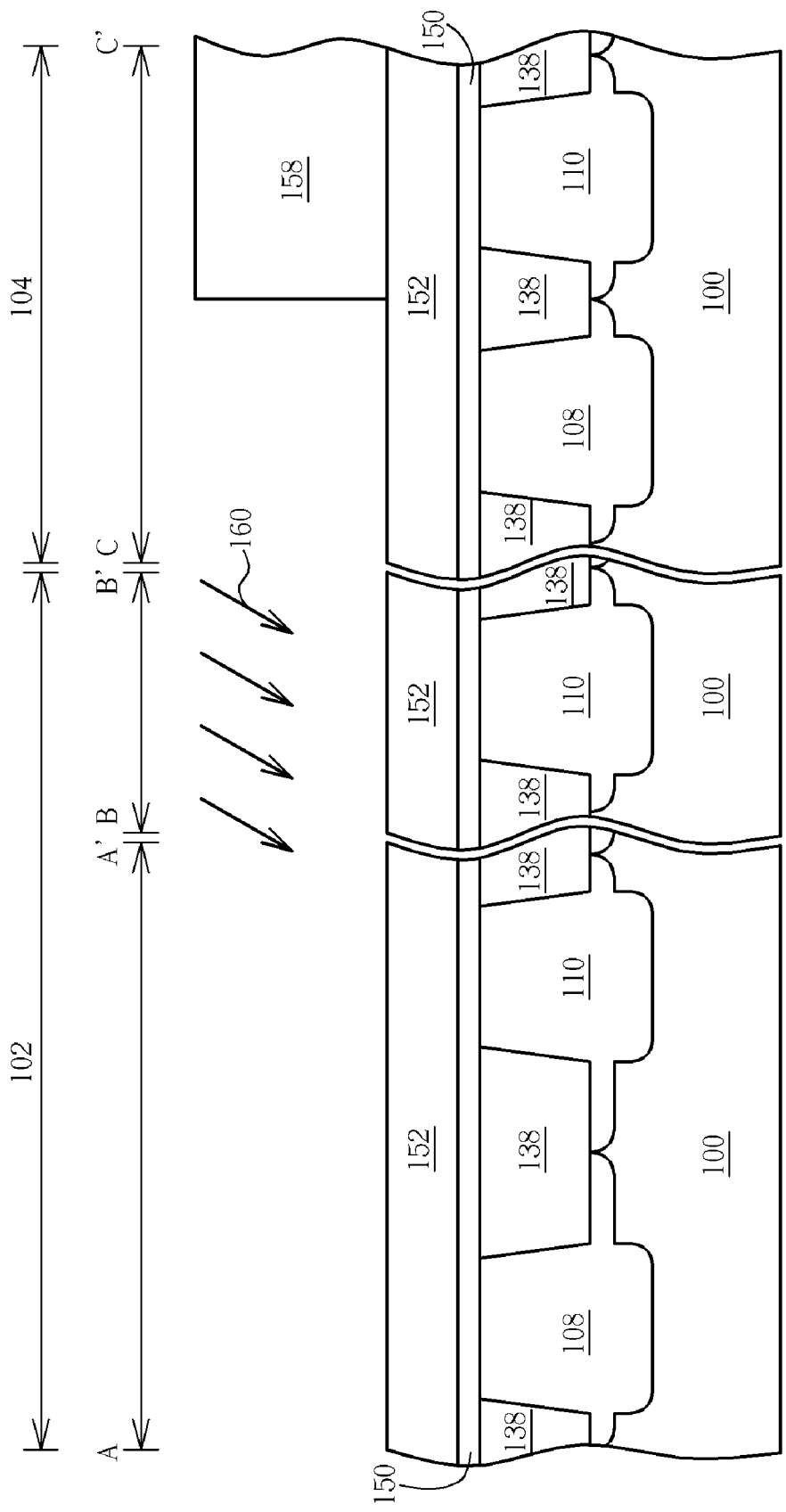

As shown in FIG. 9, a patterned mask 158 such as a photoresist is coated on the silicon layer 152 on the P well 110 in the logic area 104. Namely, the silicon layer 152 in the memory cell area 102 and the silicon layer 152 on the N well 108 in the logic area 104 are exposed. Subsequently, a P+ ion implantation process 160 is carried out to the exposed silicon layer 152. Then the patterned mask 158 is removed. As known for a person having ordinary skill in the art, the P+ ion implantation process 160 shown in FIG. 9 may be carried out before the N+ ion implantation process 156 shown in FIG. 8. Those skilled in the art will readily observe that numerous modifications and alterations of the method may be made while retaining the teachings of the invention.

Figure 10:
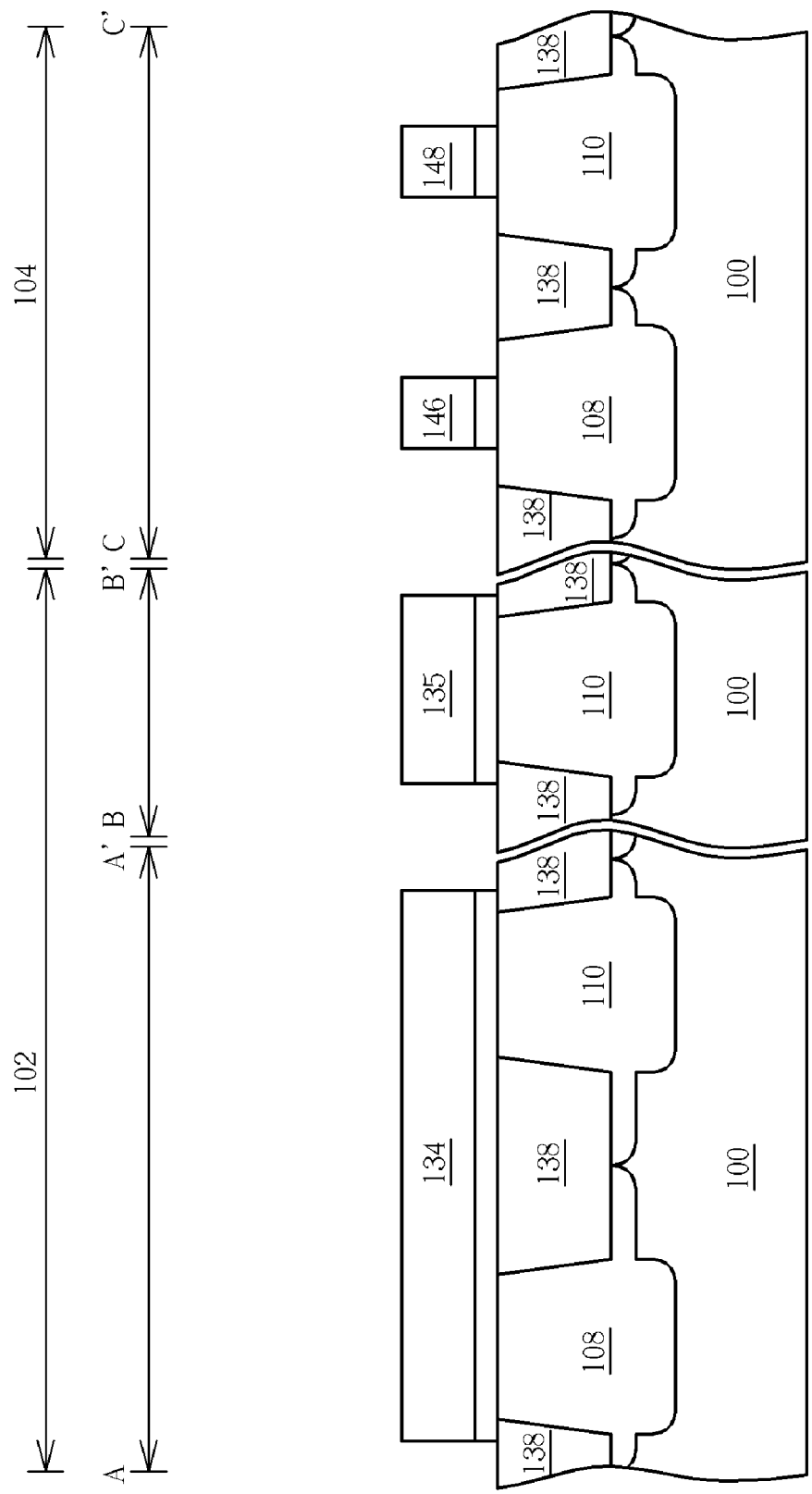

As shown in FIG. 10, an etching process (not shown) is carried out to etch the silicon layer 152 and the dielectric layer 150 thereby forming gates 134, 135, 146 and 148 as shown in FIG. 3. The gates 134, 135 and 146 are doped with P+ ions, but the gate 148 is doped with N+ ions. The N+ ion implantation process 156 and P+ ion implantation process 160 shown in FIGS. 8 and 9 may be carried out after the etching process shown in FIG. 10. Those skilled in the sequence of process will readily observe that numerous modifications and alterations of the method may be made while retaining the teachings of the invention.

Finally, spacers are formed on sidewalls of the gate 134, 135, 146 and 148. A patterned mask is coated on the N well 108 (not shown). Then, an N type source/drain implantation process is carried out thereby forming a source/drain region in the P well 110 of the semiconductor substrate 100 (not shown). Thereafter, the patterned mask is removed. Subsequently, a patterned mask is coated on the P well 110. A P type source/drain implantation process is carried out thereby forming a source/drain region in the N well 108 of the semiconductor substrate 100 (not shown). Thereafter, the patterned mask is removed. According to the preferred embodiment of this invention, the chemical composition of the N type source/drain implantation process may be any N type dopant such as phosphorus, with a dose of between about 2E15 to 3E15 ions/cm$^2$, at an energy of about 3 KeV. It should be noted that the N type source/drain implantation process might also be carried out on the gate of the pull-down transistor 126, 128 or the gate of the access transistor 130, 132. The N type source/drain ion may be treated like a complementary ion, which complements skipping the step of the N+ ion implantation process 156 performed on the gate of each transistor in the memory cell area 102.

Figure 11:
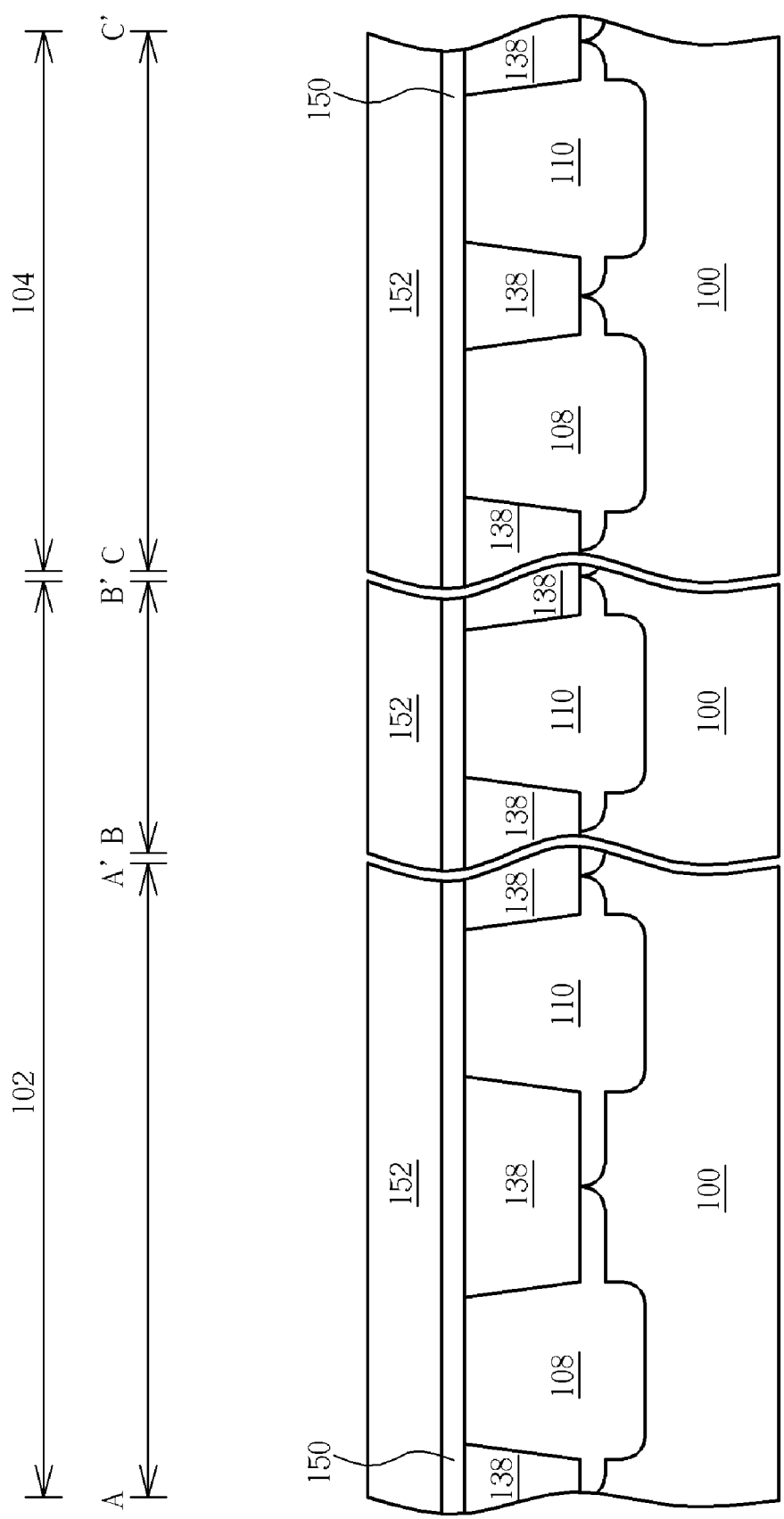
FIG. 11 to FIG. 13 shows cross-sectional diagrams taken along lines AA', BB' and CC' in FIG. 3, illustrating a fabricating method for an embedded SRAM in accordance with the third preferred embodiment of the present invention.
Figure 12:
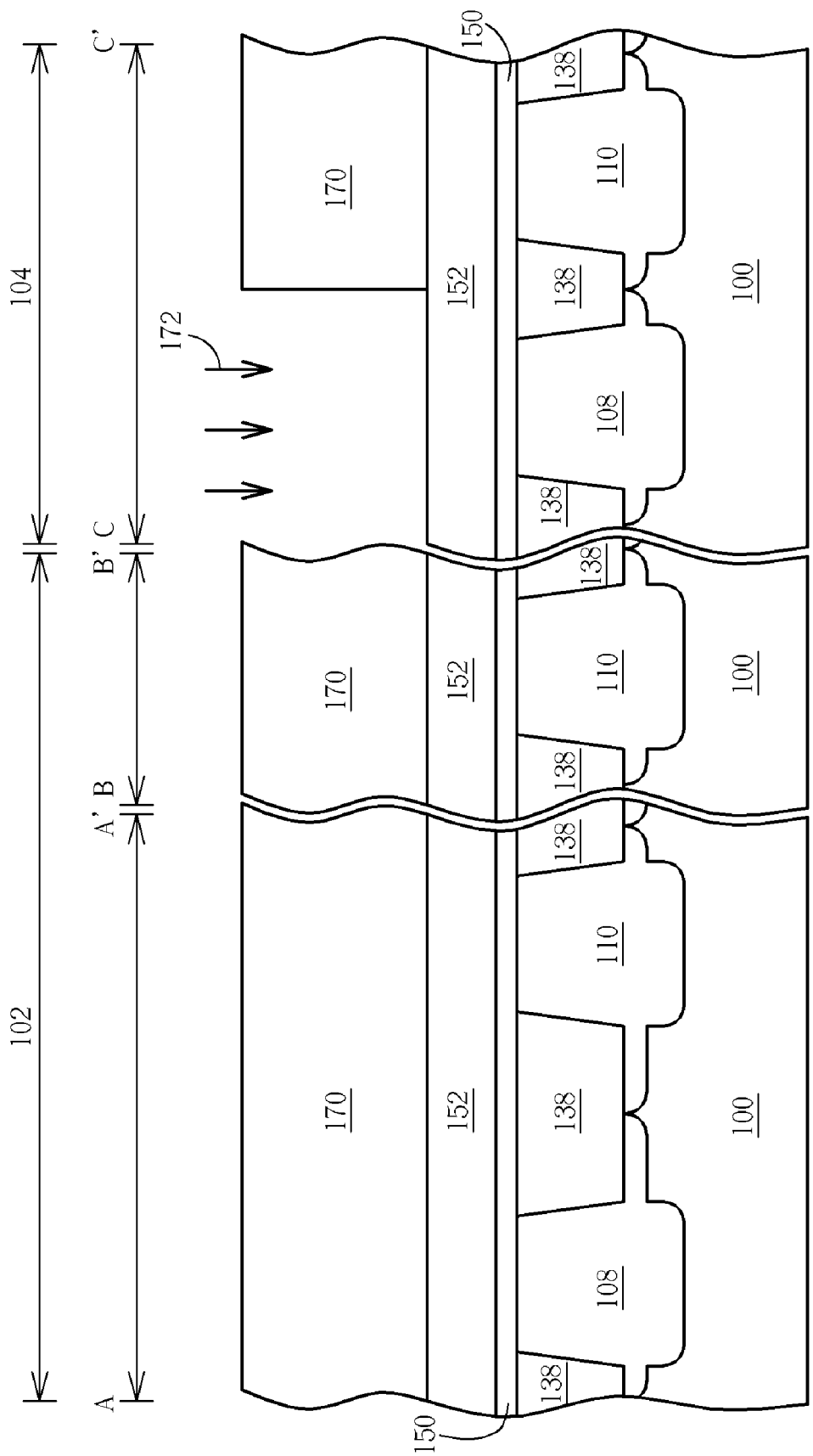
Figure 13:
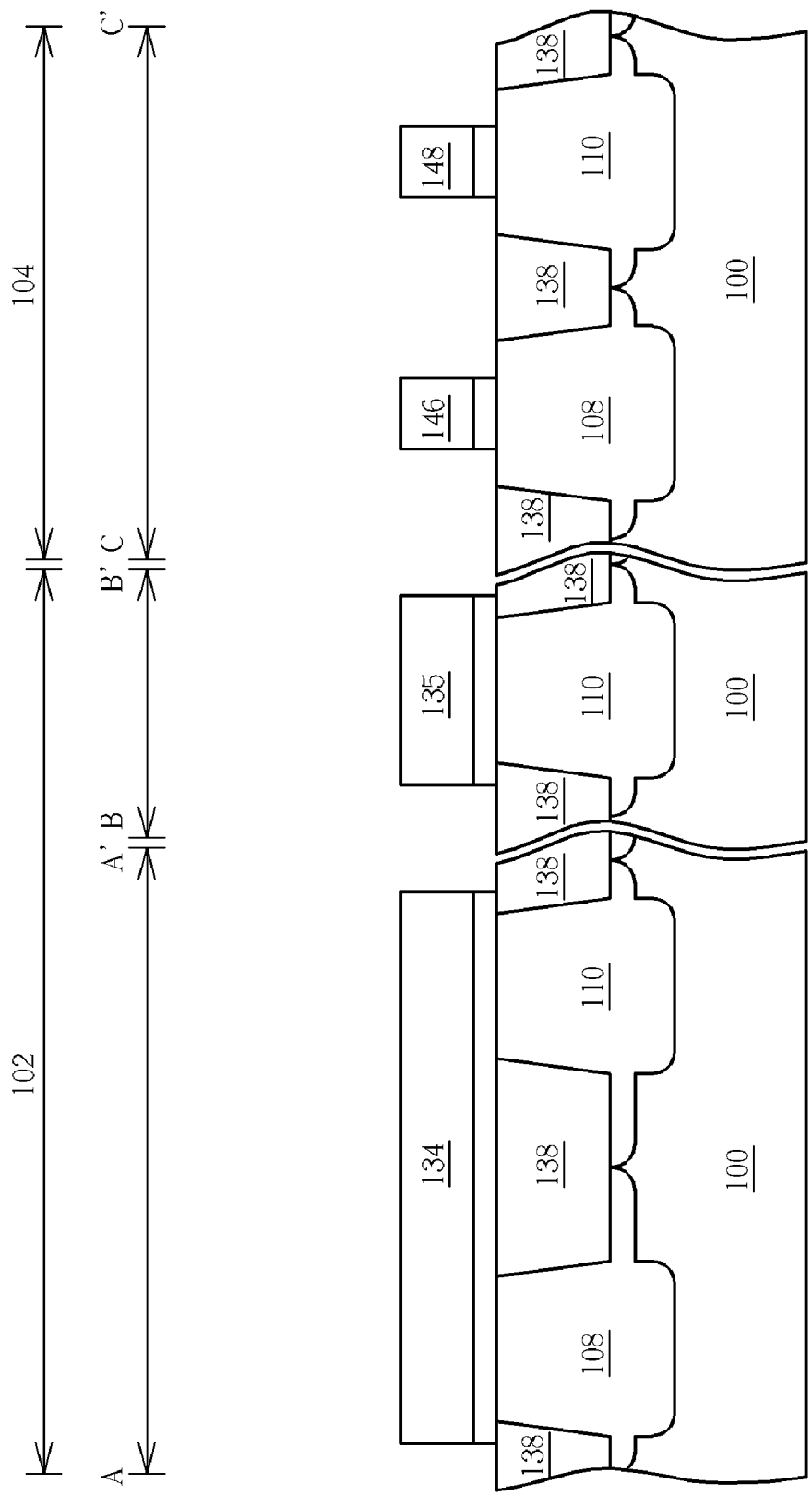

Please refer to FIG. 11 to FIG. 13, which illustrate another fabricating method for the embedded static ransom access memory shown in FIG. 3 in accordance with the third preferred embodiment of the present invention. For highlighting the characteristics of the present invention and for clarity of illustration, FIG. 11 to FIG. 13 merely show the cross-sectional diagrams taken along lines AA', BB' and CC' in FIG. 3. As shown in FIG. 11, a semiconductor substrate 100 is provided, such as a silicon substrate or a silicon-on-insulator (SOI) substrate, but not limited thereto. The semiconductor substrate 100 comprises at least an N well 108 and at least a P well 110, wherein the N well 108 and the P well 110 are isolated by a shallow trench isolation (STI) 138. Subsequently, a conformal dielectric layer 150 such as silicon oxide component, silicon nitride component or any insulating material is blanket deposited on the surface of the semiconductor substrate 100. Then, a silicon layer 152 such as polysilicon, metal silicide or any conductive material is deposited on the dielectric layer 150.

As shown in FIG. 12, a patterned mask 170 such as a photoresist is coated on the silicon layer 152 in the memory cell area 102. The patterned mask is also coated on the silicon layer 152 on the P well 110 in the logic area 104. Namely, only the silicon layer 152 on the N well 108 in the logic area 104 is exposed. Subsequently, a P+ ion implantation process 172 is carried out on the exposed silicon layer 152. Thereafter, the patterned mask 172 is removed.

As shown in FIG. 13, an etching process (not shown) is carried out to etch the silicon layer 152 and the dielectric layer 150 thereby forming gates 134, 135, 146 and 148 as shown in FIG. 3. The gates 134, 135 and 148 are doped without ions, but the gate 146 is doped with P+ ions. The P+ ion implantation process 172 shown in FIG. 12 may be carried out after the etching process shown in FIG. 13. Those skilled in the art will readily observe that numerous modifications and alterations of the method may be made while retaining the teachings of the invention.

Finally, spacers are formed on sidewalls of the gate 134, 135, 146 and 148. A patterned mask is coated on the N well 108 (not shown). Then, an N type source/drain implantation process is carried out thereby forming a source/drain region in the P well 110 of the semiconductor substrate 100 (not shown). Thereafter, the patterned mask is removed. Subsequently, a patterned mask is coated on the P well 110. A P type source/drain implantation process is carried out thereby forming a source/drain region in the N well 108 of the semiconductor substrate 100 (not shown). Thereafter, the patterned mask is removed. It should be noted that the P type source/drain implantation process might also be carried out on the silicon layer 152 of the pull-up transistors 122, 124. The P type source/drain ion may be treated like a complementary ion, which complements the skipping step of the P+ ion implantation process 172 performed on the gate of each transistor in the memory cell area 102.

Figure 14:
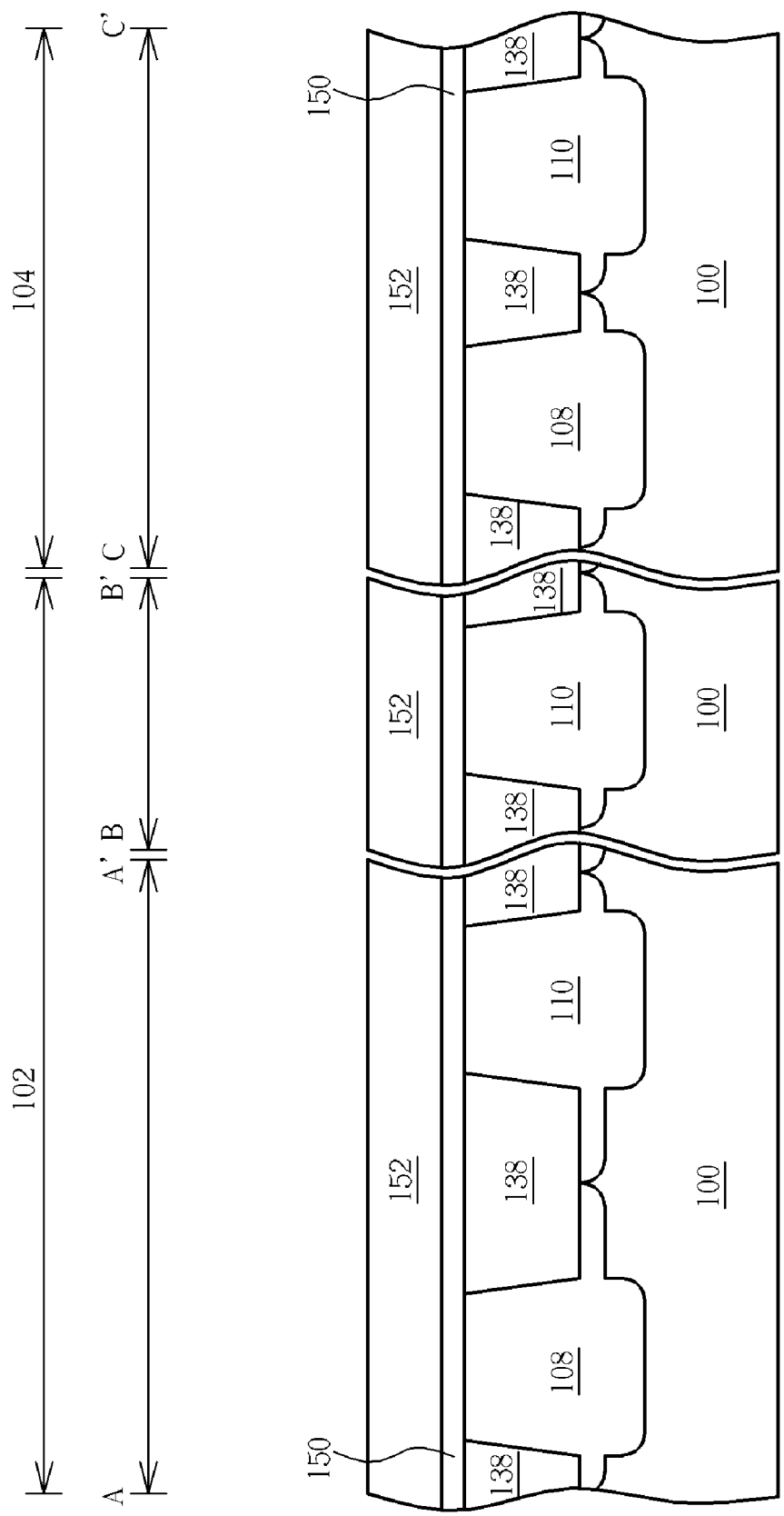
FIG. 14 to FIG. 17 shows cross-sectional diagrams taken along lines AA', BB' and CC' in FIG. 3, illustrating a fabricating method for an embedded SRAM in accordance with the fourth preferred embodiment of the present invention.

Please refer to FIG. 14 to FIG. 17, which illustrate a fabricating method for the embedded static ransom access memory shown in FIG. 3 in accordance with the fourth preferred embodiment of the present invention. For highlighting the characteristics of the present invention and for clarity of illustration, FIG. 14 to FIG. 17 merely show the cross-sectional diagrams taken along lines AA', BB' and CC' in FIG. 3. As shown in FIG. 14, a semiconductor substrate 100 is provided, such as a silicon substrate or a silicon-on-insulator (SOI) substrate, but not limited thereto. The semiconductor substrate 100 comprises at least an N well 108 and at least a P well 110, wherein the N well 108 and the P well 110 are isolated by a shallow trench isolation (STI) 138. Subsequently, a conformal dielectric layer 150 such as silicon oxide component, silicon nitride component or any insulating material is blanket deposited on the surface of the semiconductor substrate 100. Then, a silicon layer 152 such as polysilicon, metal silicide or any conductive material is deposited on the dielectric layer 150.

Figure 15:
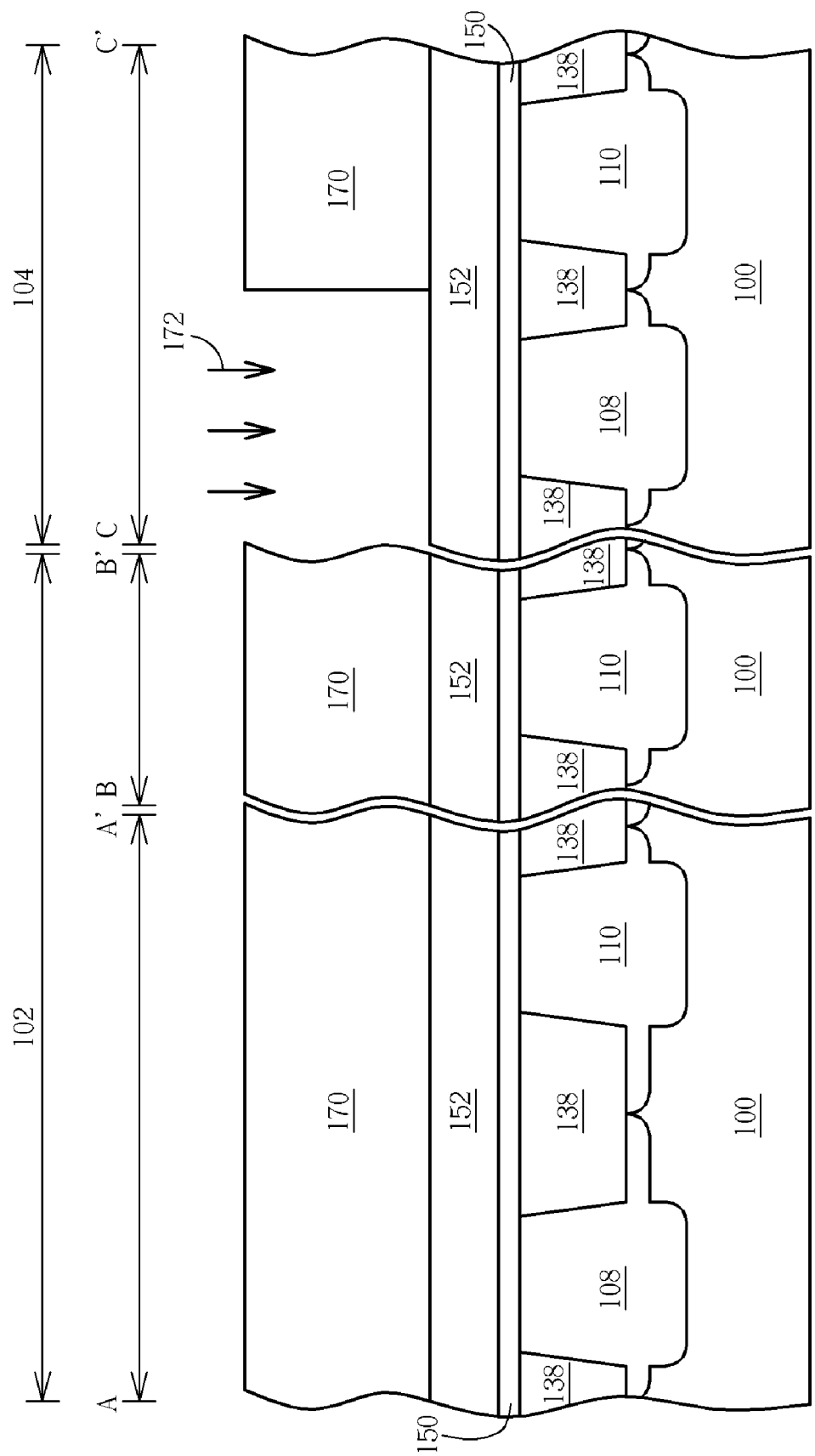

As shown in FIG. 15, a patterned mask 170 such as a photoresist is coated on the silicon layer 152 in the memory cell area 102. The patterned mask is also coated on the silicon layer 152 on the P well 110 in the logic area 104. Namely, only the silicon layer 152 on the N well 108 in the logic area 104 is exposed. Subsequently, a P+ ion implantation process 172 is carried out on the exposed silicon layer 152. Thereafter, the patterned mask 170 is removed.

Figure 16:
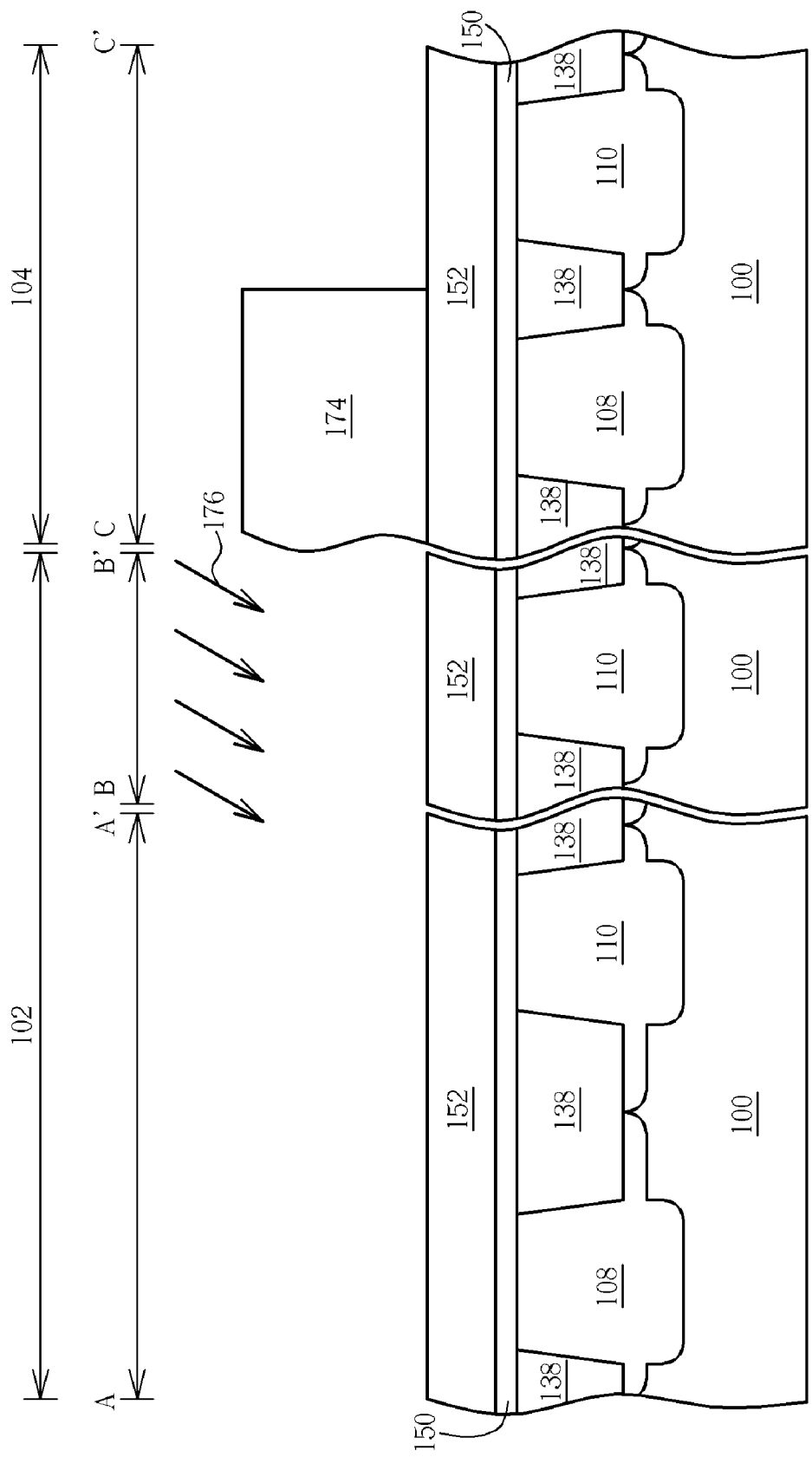

As shown in FIG. 16, a patterned mask 174 such as a photoresist is coated on the silicon layer 152 on the N well 108 in the logic area 104. The silicon layer 152 in the memory cell area 102 and the silicon layer 152 on the P well 110 in the logic area 104 are exposed. Subsequently, an N+ ion implantation process 176 is carried out on the exposed silicon layer 152. Then the patterned mask 174 is removed. As known by a person having ordinary skill in the art, the N+ ion implantation process 176 shown in FIG. 16 may be carried out before the P+ ion implantation process 172 shown in FIG. 15. Those skilled in the art will readily observe that numerous modifications and alterations of the method may be made while retaining the teachings of the invention.

Figure 17:
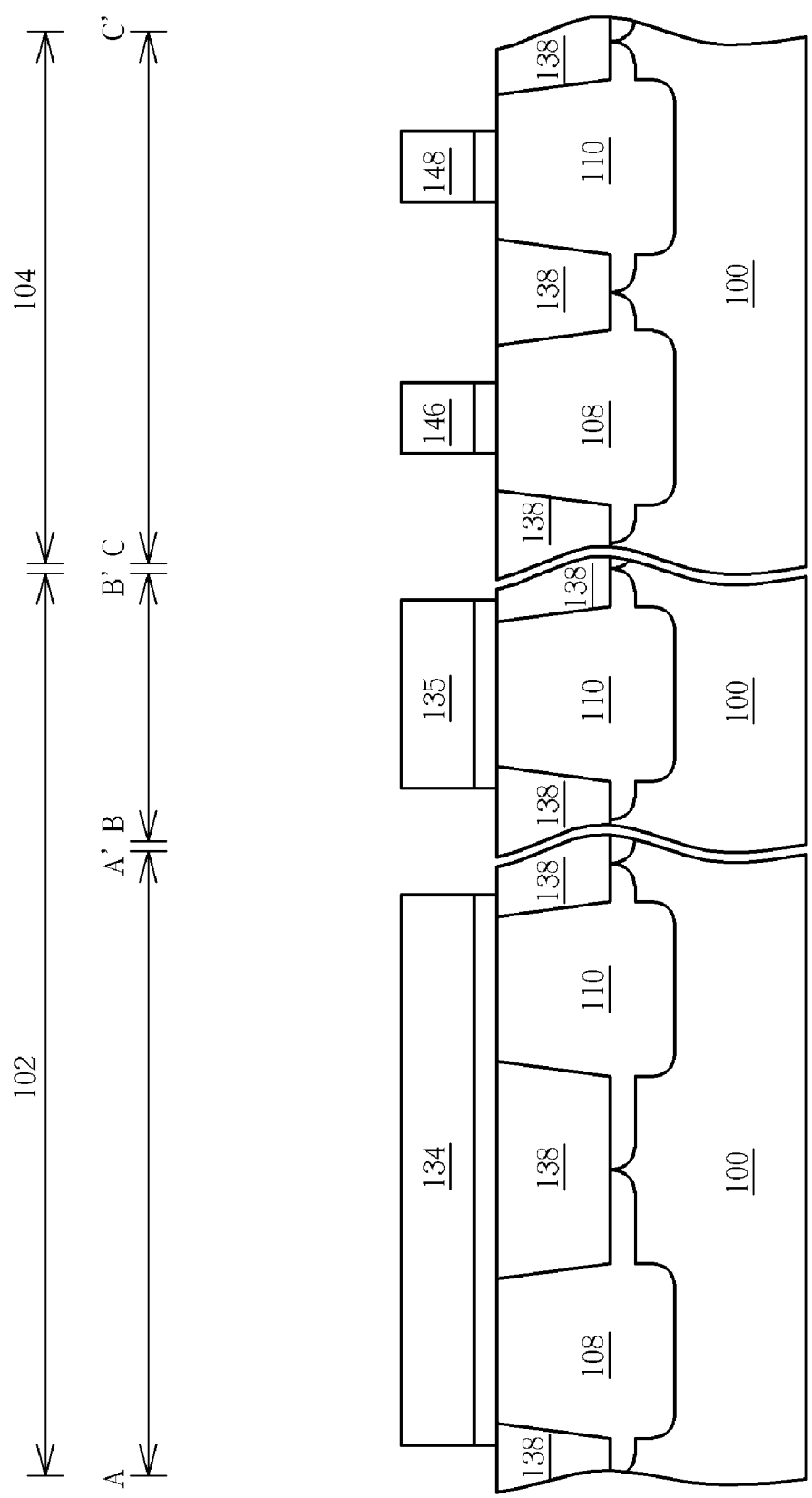

As shown in FIG. 17, an etching process (not shown) is carried out to etch the silicon layer 152 and the dielectric layer 150 thereby forming gates 134, 135, 146 and 148 as shown in FIG. 3. The gates 134, 135 and 148 are doped with N+ ions, and the gate 146 is doped with P+ ions. The P+ ion implantation process 172 and the N+ ion implantation process 176 shown in FIGS. 15 and 16 may be carried out after the etching process shown in FIG. 17. Those skilled in the art will readily observe that numerous modifications and alterations of the method may be made while retaining the teachings of the invention.

Finally, spacers are formed on sidewalls of the gate 134, 135, 146 and 148. A patterned mask is coated on the N well 108 (not shown). Then, an N type source/drain implantation process is carried out thereby forming a source/drain region in the P well 110 of the semiconductor substrate 100 (not shown). Thereafter, the patterned mask is removed. Subsequently, a patterned mask is coated on the P well 110. A P type source/drain implantation process is carried out thereby forming a source/drain region in the N well 108 of the semiconductor substrate 100 (not shown). It should be noted that the P type source/drain implantation process might also be carried out on the gate of the pull-up transistors 122, 124. The P type source/drain ion may be treated like a complementary ion, which complements skipping the step of the P+ ion implantation process 172 performed on the gate of each transistor in the memory cell area 102.

Since the present invention provides a method for fabricating an embedded SRAM by preserving the N+ ion implantation process to the transistors in the logic area in accordance with the prior art, but skips the N+ ion implantation process in the memory cell area, the problem of the symmetrical gate having unsymmetrical concentration will not occur. Additionally, the RSB failure rate of SRAM can be reduced, while still keeping a proper Tox_INV for transistors in the logic area. It should be noted that the method for fabricating an embedded static random access memory in accordance with the present invention is not limited to a 6T-SRAM, and may be applied to any semiconductor manufacture such as 4T-SRAM or inverter.

Those skilled in the art will readily observe that numerous modifications and alterations of the device and method may be made while retaining the teachings of the invention.

What is claimed is:

1. A method for fabricating an embedded static random access memory (eSRAM), comprising:
   providing a semiconductor substrate, the semiconductor substrate defining a logic area and a memory cell area, wherein at least a first conductive device area and at least a second conductive device area are defined on the logic area and the memory cell area respectively;
   forming a patterned mask on the memory cell area and the second conductive device area in the logic area, and exposing the first conductive device area in the logic area;
   performing a first conductive ion implantation process on the exposed first conductive device area in the logic area; and
   removing the patterned mask.

2. The method of fabricating an eSRAM according to claim 1, further comprising forming a silicon layer before the first conductive ion implantation process is performed.

3. The method of fabricating an eSRAM according to claim 2, further comprising providing an etching process to form a gate in the first conductive device area and the second conductive device area after removing the patterned mask.

4. The method of fabricating an eSRAM according to claim 3, further comprising providing a second conductive ion implantation process on the second conductive device area in the memory cell area before the etching process.

5. The method of fabricating an eSRAM according to claim 4, wherein the second conductive ion implantation process is also provided to the first conductive device area in the memory cell area.

6. The method of fabricating an eSRAM according to claim 3, wherein the gate formed in the first conductive device area and the second conductive device area is a common gate.

7. The method of fabricating an eSRAM according to claim 2, further comprising forming a dielectric layer between the semiconductor substrate and the silicon layer.

8. The method of fabricating an eSRAM according to claim 1, wherein the first conductivity type is N type and the second conductivity type is P type.

9. The method of fabricating an eSRAM according to claim 8, wherein the first conductive device area in the logic area is an NMOS transistor area, the second conductive device area in the logic area is a PMOS transistor area, the first conductive device area in the memory cell area is a pull-down transistor area, and the second conductive device area in the memory cell area is a pull-up transistor area.

10. The method of fabricating an eSRAM according to claim 9, further comprising providing at least an N type ion implantation process to form a source/drain region in the NMOS transistor area and the pull-down transistor area.

11. The method of fabricating an eSRAM according to claim 9, further comprising providing at least a P type ion implantation process to form a source/drain region in the PMOS transistor area and the pull-down transistor area.

12. The method of fabricating an eSRAM according to claim 1, wherein the first conductive type is P type and the second conductive type is N type.

13. The method of fabricating an eSRAM according to claim 12, wherein the first conductive device area in the logic area is a PMOS transistor area, the second conductive device area in the logic area is an NMOS transistor area, the first conductive device area in the memory cell area is a pull-up transistor area, and the second conductive device area in the memory cell area is a pull-down transistor area.

14. The method of fabricating an eSRAM according to claim 13, further comprising providing at least a P type ion implantation process to form a source/drain region in the PMOS transistor area and the pull-up transistor area.

15. The method of fabricating an eSRAM according to claim 13, further comprising providing at least an N type ion implantation process to form a source/drain region in the NMOS transistor area and the pull-down transistor area.

16. The method of fabricating an eSRAM according to claim 1, further comprising forming a gate in the first conductive device area and the second conductive device area respectively before the first conductive ion implantation.

17. A method for fabricating an embedded static random access memory (eSRAM), comprising:
providing a semiconductor substrate, the semiconductor substrate defining a logic area and a memory cell area, wherein at least an NMOS transistor area and at least a PMOS transistor area are defined in the logic area, and at least a pull-up transistor area and at least a pull-down transistor area are defined in the memory cell area;
forming a patterned mask on the pull-up transistor area, pull-down transistor area in the memory cell area and the PMOS transistor area in the logic area, and exposing the NMOS transistor area in the logic area;
performing an N type ion implantation process on the exposed NMOS transistor area in the logic area; and
removing the patterned mask.

18. The method of fabricating an eSRAM according to claim 17, further comprising providing a P type ion implantation process to the pull-down transistor area.

19. The method of fabricating an eSRAM according to claim 18, wherein the P type ion implantation process is also provided to the pull-up transistor area.

20. A method for fabricating an embedded static random access memory (eSRAM), comprising:
providing a semiconductor substrate, the semiconductor substrate defining a logic area and a memory cell area, wherein at least a NMOS transistor area and at least a PMOS transistor area are defined in the logic area, and at least a pull-up transistor area and at least a pull-down transistor area are defined in the memory cell area;
forming a patterned mask on the pull-up transistor area, pull-down transistor area in the memory cell area and the NMOS transistor area in the logic area, and exposing the PMOS transistor area in the logic area;
performing a P type ion implantation process on the exposed PMOS transistor area in the logic area; and
removing the patterned mask.

21. The method of fabricating an eSRAM according to claim 20, further comprising providing an N type ion implantation process to the pull-down transistor area.

22. The method of fabricating an eSRAM according to claim 20, wherein the N type ion implantation process is also provided to the pull-up transistor area.

* * * * *